(12) United States Patent
Chin

(10) Patent No.: US 7,070,436 B2
(45) Date of Patent: Jul. 4, 2006

(54) ELECTRICAL CONNECTOR ASSEMBLY HAVING REINFORCING MECHANISM

(75) Inventor: Ching-Kuo Chin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/821,347

(22) Filed: Apr. 9, 2004

(65) Prior Publication Data

US 2004/0203266 A1  Oct. 14, 2004

(30) Foreign Application Priority Data

Apr. 9, 2003  (TW)  .............................. 92205561 U

(51) Int. Cl.
*H01R 13/625* (2006.01)
(52) U.S. Cl. ........................................ 439/342; 439/73
(58) Field of Classification Search ................ 439/342, 439/73, 330–331, 263–266
See application file for complete search history.

(56) References Cited

U.S. PATENT DOCUMENTS

| | | | | |
|---|---|---|---|---|
| 5,482,471 A | * | 1/1996 | Mori et al. | 439/263 |
| 5,646,447 A | * | 7/1997 | Ramsey et al. | 257/727 |
| 5,722,848 A | * | 3/1998 | Lai et al. | 439/342 |
| 6,752,636 B1 | * | 6/2004 | Ma | 439/73 |
| 6,780,024 B1 | * | 8/2004 | Ma | 439/73 |
| 6,969,267 B1 | * | 11/2005 | Byquist | 439/73 |
| 2004/0192083 A1 | * | 9/2004 | Byquist | 439/73 |

\* cited by examiner

*Primary Examiner*—Michael C. Zarroli
(74) *Attorney, Agent, or Firm*—Wei Te Chung

(57) ABSTRACT

An electrical connector assembly (10) includes a socket body (50), a frame (20) arranged around the socket body, and a socket plate (30) and a load lever (40) mounted to opposite ends of the socket body respectively. The socket body has a number of first sidewalls (505, 506). The first sidewalls form a number of protrusions (502) distant from a center of the socket body on exterior surfaces. The frame includes a number of second sidewalls (201, 202). The second sidewalls correspondingly define a number of slots (204) to mate with the respective protrusions. Via engagement between the protrusions and the corresponding slots, the frame can press down the socket body and prevent opposite ends of the socket body from bending upward, thereby reinforcing the socket body.

17 Claims, 5 Drawing Sheets

ELECTRICAL CONNECTOR ASSEMBLY HAVING REINFORCING MECHANISM

BACKGROUND OF THE INVENTION

1. Field of the Invention

The present invention relates to electrical connector assemblies, and more particularly, to an electrical connector assembly having reinforcing mechanism for electrically connecting two electrical interfaces, such as an integrated circuit (IC) package and a printed circuit board (PCB).

2. Description of the Prior Art

An electrical connector assembly is commonly used to route signal and power between two electrical interfaces, such as an IC package and a PCB. Normally, an electrical connector assembly comprises a socket body, a frame set around the socket body, and a plurality of contacts received in the socket body. Each contact includes a spring arm and a soldering section protruding beyond two opposite external surfaces of the socket body. In installation, the spring arm is resiliently urged to electrically engage the IC package. The soldering section is connected to a respective conductive pad arranged on the PCB.

Referring to FIGS. 4 and 5, a conventional electrical connector assembly 8 includes a socket body 81, a frame 82 provided around the socket body 81, and a socket plate 83 and a load lever 84 respectively mounted to two opposite ends of the socket body 81. In assembly, the socket body 81 is mounted to the PCB 7 via soldering balls (not shown). The frame 82 set around the socket body 81 is assembled to the PCB 7 via a plurality of screws 86. In use, the IC package (not shown) is held on the socket body 81 via engagement between the socket plate 83 and the load lever 84.

In assembly, the contacts 84 are soldered to respective conductive pads (not shown) on the PCB 7 via soldering balls. The soldering balls disposed at soldering sections (not shown) melt while heated and solidify while cooled, thereby connecting the conductive pads with the contacts 84. During this process, the socket body 81 and the PCB 7 both expand while heated and contract while cooled. A relative displacement is liable to occur because the socket body 81 and the PCB 7 have different coefficients of thermal expansion. Consequently, a tensile force is likely to occur between the socket body 81 and the soldering balls.

In installation, prior to positioning the IC package on the socket body 81, the socket plate 83 and the load lever 84 are rotated afar relative to the socket body 81. When the IC package is positioned on the socket body 81, the socket plate 83 is rotated to engage with a top surface of the IC package. The load lever 84 is rotated to clip the socket plate 83. Thus, the IC package is held on the socket body 81 via engagement between the socket plate 83 and the load lever 84.

Because the load lever 84 presses down on the socket plate 83, and the socket plate 83 press down on the top surface of the IC package, the socket plate 83 and the load lever 84 simultaneously pull up the opposite ends of the socket body 81 to counterbalance the pressing forces. Therefore, a remarkable tensile force may be prone to grow between the socket body 81 and the soldering balls.

The above mentioned tensile forces fully act on the contacts 84 and cause the deformation of the socket body 81. As a result, the contacts 84, especially the contacts 84 distant from a center of the socket body 81, may become inadvertently separated from the conductive pads, thereby decreasing reliability of mechanical and electrical characteristics of the electrical connector assembly 8.

Heretofore, there have been different efforts to provide an electrical connector assembly with reinforced socket body, for instance, adding metal frame on exterior surface of the socket body and inserting metal in the socket body. These will result in increased complexity and higher cost of manufacture and are not desired.

Hence, a new electrical connector assembly which overcomes the above-outlined disadvantages of the prior art is desired.

SUMMARY OF THE INVENTION

Accordingly, a primary object of the present invention is to provide an electrical connector assembly with a reinforcing mechanism, to reinforce a socket body and relieve tensile forces resulted between the socket body and the soldering balls during assembly or installation.

In order to achieve the object, an electrical connector assembly in accordance with the present invention comprises a socket body having a connecting section and a retaining section at opposite ends, a frame arranged around the socket body, a socket plate connected to the connecting section, and a load lever assembled to the retaining section. The socket body includes a plurality of first sidewalls. The first sidewalls form a plurality of protrusions on exterior surface, adjacent the connecting section and the retaining section respectively. The frame includes a plurality of second sidewalls cooperatively defining an opening to receive the socket body. The second sidewalls define a plurality of slots correspondingly to mate with the respective protrusions.

Via engagement between the protrusions of the socket body and the respective slots of the frame, the tensile forces between the socket body and the soldering balls are remarkably relieved. Thus the socket body is effectively reinforced and mechanical and electrical characteristics of the electrical connector assembly are ensured.

Other objects, advantages, and novel features of the present invention will become more apparent from the following detailed description of the preferred embodiment of the invention while taken in conjunction with the appended drawings, in which:

DETAILED DESCRIPTION OF THE PREFERRED EMBODIMENT OF THE INVENTION

Reference will now be made to describe the present invention in detail.

Figure 1:
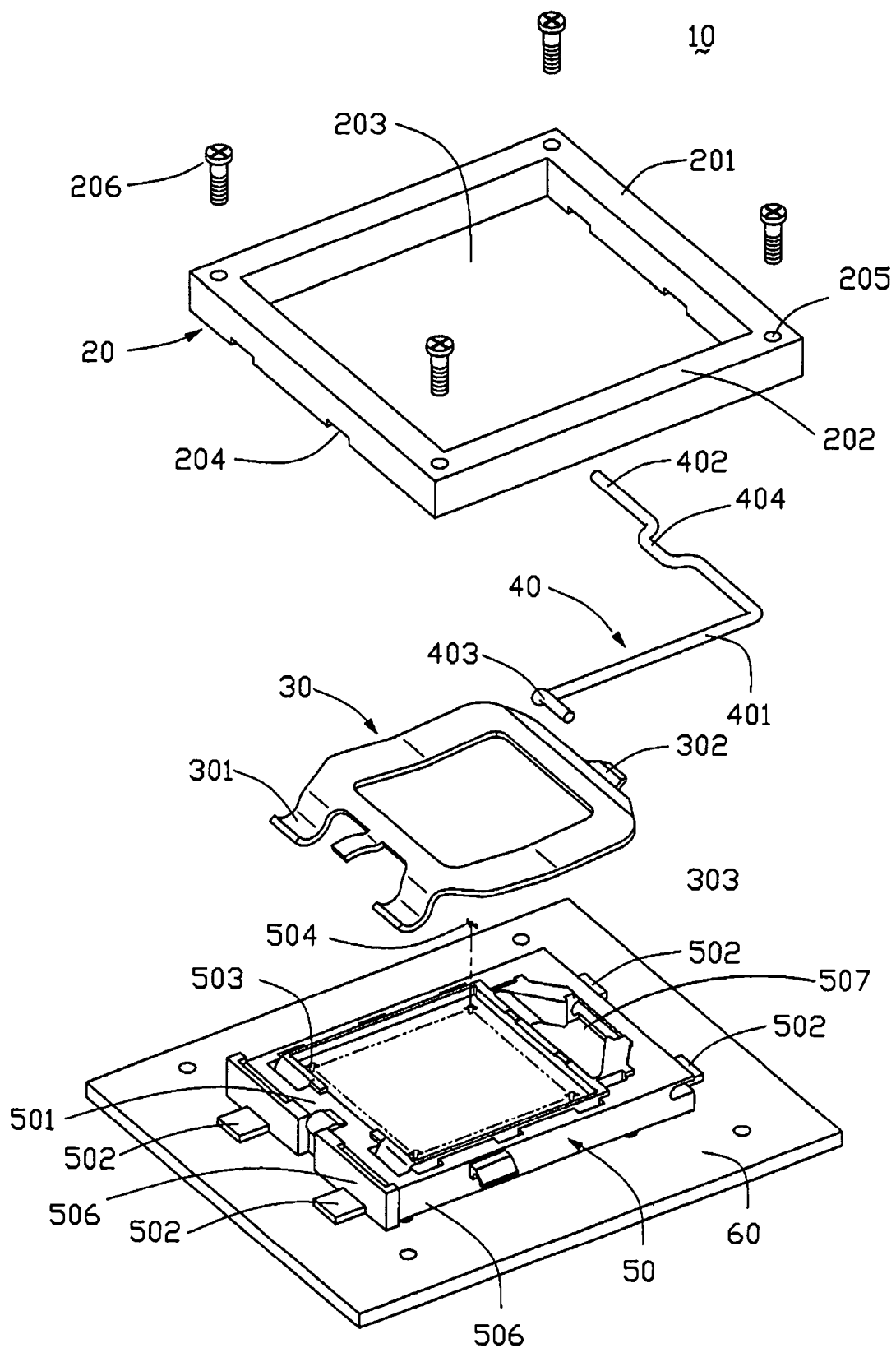
FIG. 1 is an exploded, isometric view of an electrical connector assembly in accordance with a preferred embodiment of the present invention.
Figure 2:
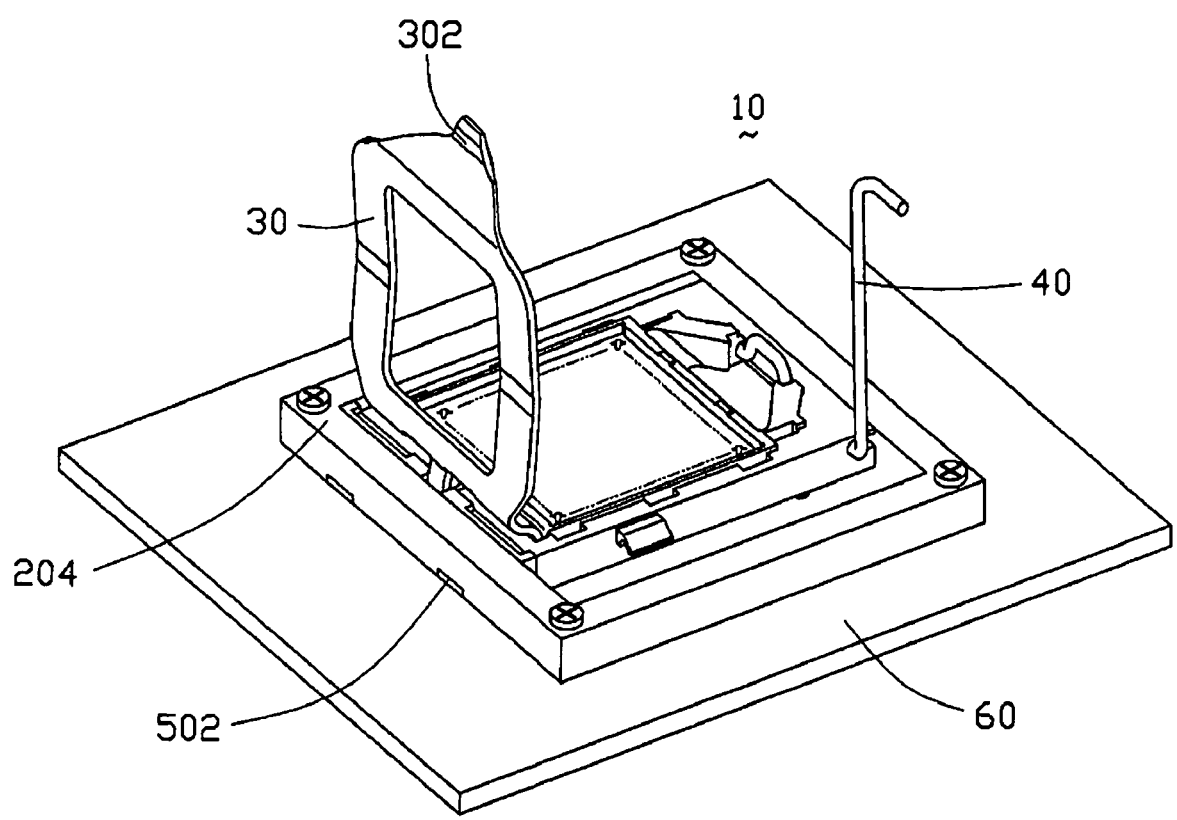
FIG. 2 is an assembled, isometric view of FIG. 1, showing a socket plate and a load lever of the electrical connector assembly in an open position.
Figure 3:
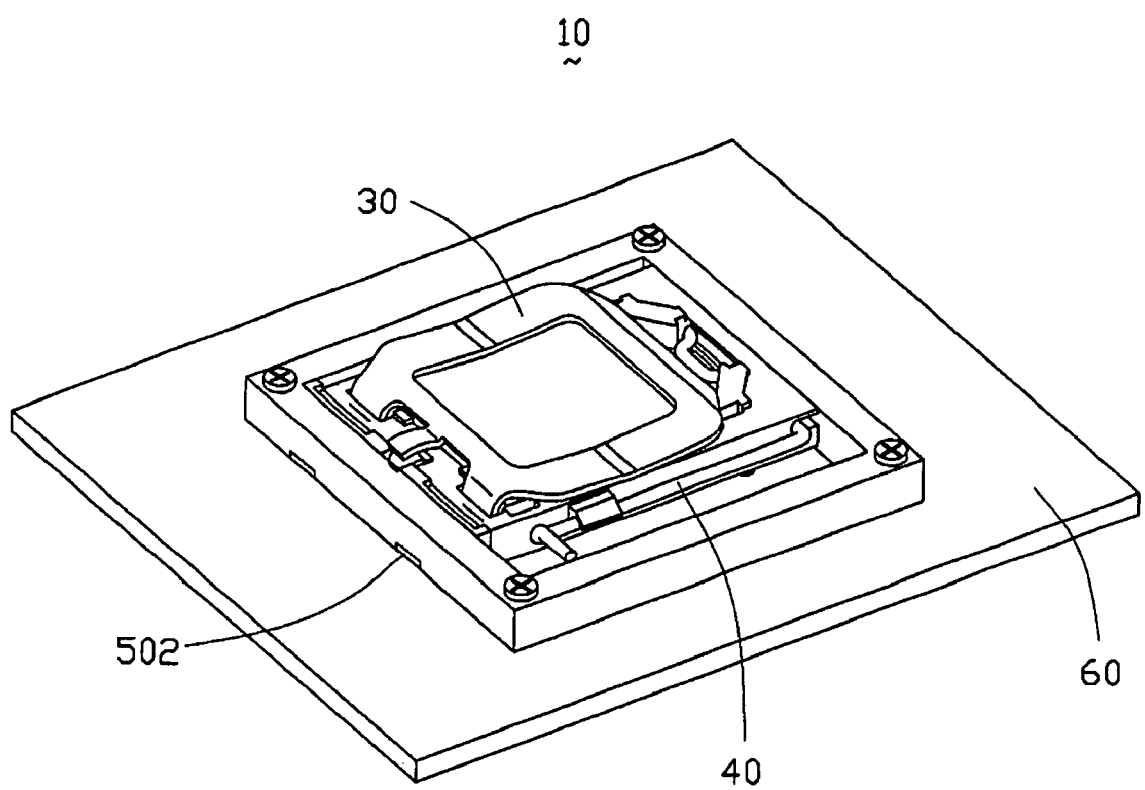
FIG. 3 is similar to FIG. 2, but showing the socket plate and the load lever in a closed position.
Figure 4:
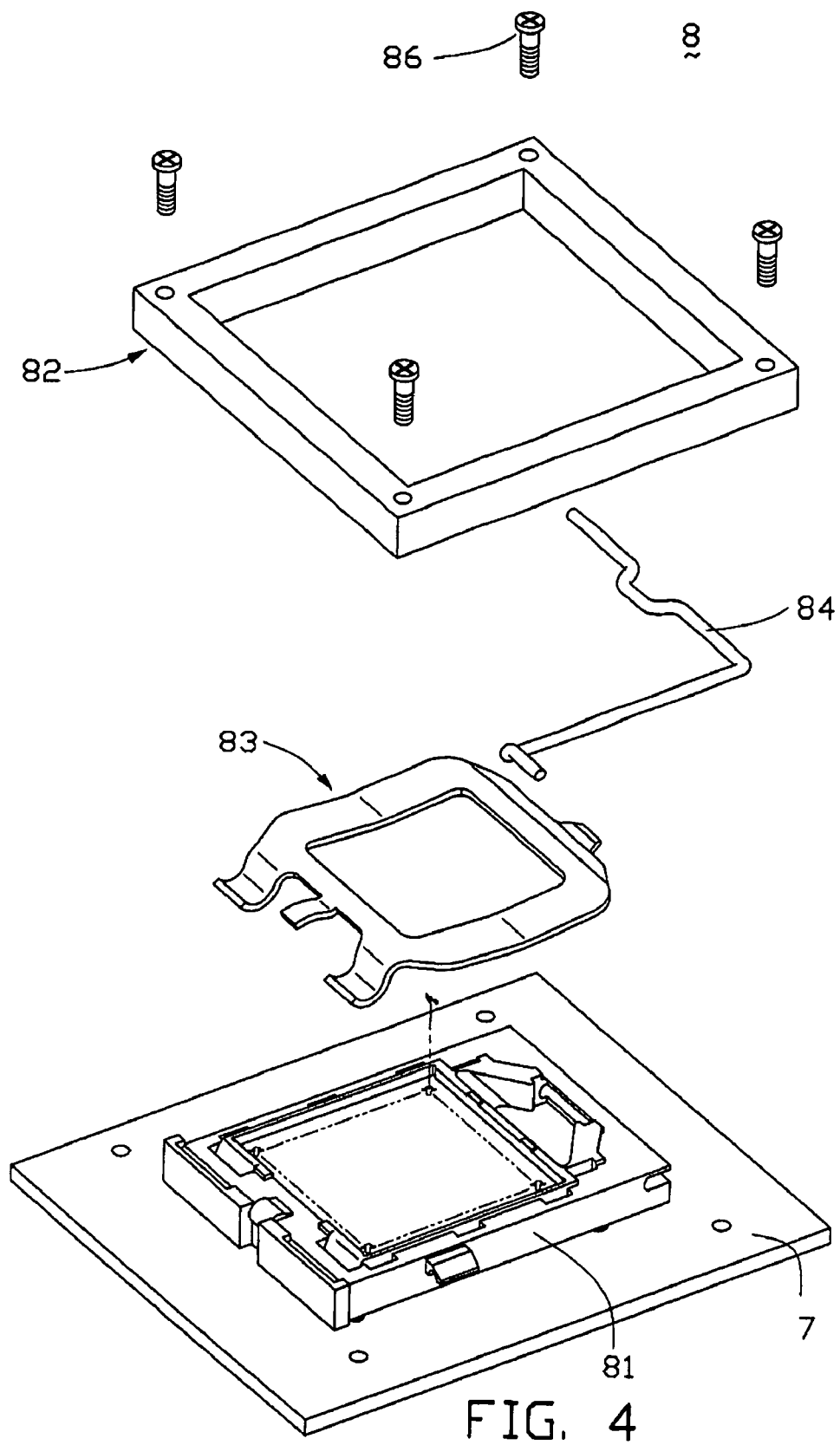
FIG. 4 is an exploded, isometric view of a conventional electrical connector assembly.
Figure 5:
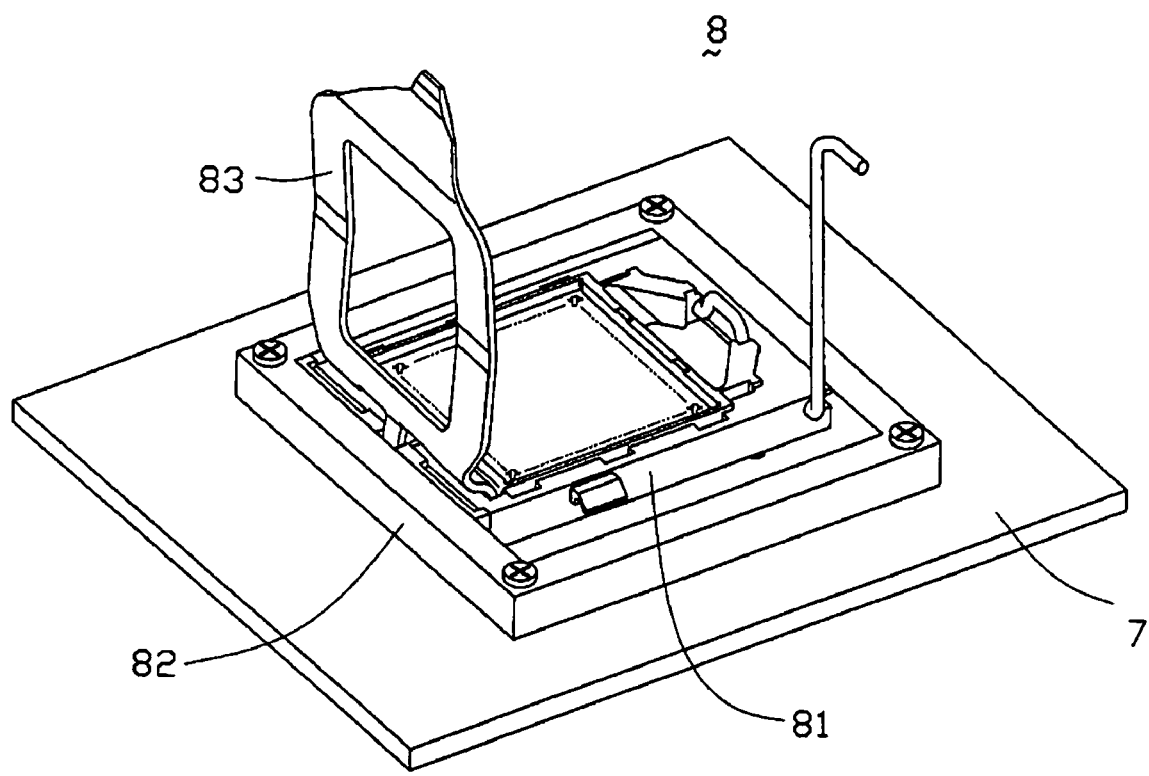
FIG. 5 is an assembled, isometric view of FIG. 4, showing a socket plate and a load lever of the conventional electrical connector assembly in an open position.

FIGS. 1–3 show an electrical connector assembly 10 in accordance with a preferred embodiment of the present invention, for electrically connecting an IC package with a PCB. The electrical connector assembly 10 includes a substantially rectangular socket body 50, a frame 20 arranged around the socket body 50, and a socket plate 30 and a load lever 40 mounted to opposite ends of the socket body 50.

The socket body 50 includes a plurality of first sidewalls 505, 506. The first sidewalls 505, 506 cooperatively form a planar configuration to hold the IC package (not shown) thereon. The socket body 50 forms a connecting section 501 to pivotally accommodate the socket plate 30, and a retaining section 507 opposite to the connecting section 501, to receive the load lever 40. The load lever 40 rotates around an axis to press or release the socket plate 30. A plurality of protrusions is formed on exterior surfaces of the first sidewalls 505, 506, adjacent the connecting section 501 and the retaining section 507 respectively. An array of passageways 503 is defined in a center of the socket body 50 for receiving contacts 504 therein, respectively.

The frame 20 includes a plurality of second sidewalls 201, 202. The second sidewalls 201, 202 cooperatively define a rectangular opening 203 to accommodate the socket body 50. The size and shape of the opening 203 is dimensioned according to the socket body 50. The second sidewalls correspondingly define a plurality of slots to mate with the corresponding protrusions respectively. In another embodiment of the present invention, the protrusions 502 are elongated integral blocks projected outwardly from the first sidewalls 505, 506, and the slots 204 are elongated recesses accordingly. In addition, if the sidewalls 201, 202 are thick enough, the slots 204 do not extend across the sidewalls 201, 202. A plurality of mounting sections 205 is defined at a top surface of the frame 20, and a plurality of screws 206 set therein is used to secure the frame 20 to the printed circuit board 60.

The socket plate 30 is a rectangular configuration frame with inwardly bent clapping sections 303 in a middle thereof. The socket plate 30 extends out a pair of braces 301 to engage with the connecting section 501 at one end, and forms a pressing end 302 to mate with the load lever 40 at an opposite end. In installation, when the pressing end 302 is clipped with the load lever 40, the inwardly bent sections 303 are substantially urged to the top surface of the IC package.

The load lever 40 includes a driving end 401 and a retaining end 402 substantially perpendicular to the driving end 401. The driving end 401 forms a handle 403 at distal end. An offset fastening section 404 is formed at a center of the retaining end 402.

In assembly, the socket plate 30 is pivotally connected to the connecting section 501 via braces 301, while the retaining end 402 of the load lever 40 is detachably received in the retaining section 507. Subsequently, the socket body 50, fixed with load lever 40 and socket plate 30, is mounted on the PCB 60 via soldering balls (not shown), with the opening 203 receiving the socket body 50 and the protrusions 502 mating with the respective slots 204. The frame 20 is secured to the PCB 60 via a plurality of screws 206 set in the mounting section 205.

In installation, prior to setting the IC package on the socket body 50, the socket plate 30 and the load lever 40 are rotated away from the socket body 50. When the IC package is positioned on the socket body 50, with the conductive pads connecting with corresponding contacts 504, the socket plate 30 is rotated toward the IC package until the clapping portion 303 contact with the top surface of the IC package. The driving end 401 is rotated to engage the socket plate 30 with the load lever 40 and push the IC package to move down. In the closed position, the pressing end 302 of the socket plate 30 substantially engages with the fastening section 404 of the load lever 40. Thus, the IC package is held on the socket body 50 securely. Reliable electrical connection between the IC package and the PCB 60 is attained.

Via engagement between the protrusions 502 and the corresponding slots 204, the frame 20 securely fixed to the PCB 60 can press down the socket body 50, and prevent opposite ends of the socket body 50 from bending upward. Accordingly, the tensile forces between the socket body 50 and the soldering balls are remarkably relieved. Even those soldering balls distant from the center of the socket body 50 can substantially engage with respective conductive pads arranged on the IC package. Therefore, the socket body 50 is reinforced and mechanical and electrical characteristics of the electrical connector assembly 10 are ensured.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical connector assembly for electrically connecting two electrical interfaces, comprising:
    a socket body comprising a plurality of first sidewalls, and two opposite first sidewalls forming a connecting section and a retaining section respectively;
    a frame having a plurality of second sidewalls cooperatively defining an opening to accommodate the socket body;
    a socket plate mounted to the connecting section; and
    a load lever assembled to the retaining section to engage with the socket plate,
    wherein the first sidewalls form a plurality of protrusions on the exterior surface adjacent the connecting section and the retaining section, and the second sidewalls correspondingly define a plurality of slots to mate with the protrusions, thereby reinforcing the socket body via engagement between the protrusions and the slots; wherein
    the frame is stationary during the entire operation of the lever and provides a downward force upon the protrusions so as not to allow the socket body to move upwardly.

2. The electrical connector assembly as defined in claim 1, wherein said socket body has a longitudinal symmetrical axis, and said protrusions are symmetrically arranged about the longitudinal symmetrical axis.

3. The electrical connector assembly as defined in claim 2, wherein said protrusions are positioned close to the printed circuit board.

4. The electrical connector assembly as defined in claim 2, wherein said protrusions comprise a plurality of blocks separated from each other.

5. The electrical connector assembly as defined in claim 2, wherein said protrusions comprise integral blocks.

6. The electrical connector assembly as defined in claim 4, wherein said protrusions are integrally formed with the socket body.

7. The electrical connector assembly as defined in claim 2, wherein said slots extend across the second sidewalls.

8. The electrical connector assembly as defined in claim 2, wherein said slots do not extend across the second sidewalls.

9. An electrical connector assembly for electrically connecting an electrical package with a circuit substrate, comprising:
a socket body having a connecting section and a retaining section at opposite ends thereat, and comprising a plurality of first sidewalls;
a frame having a plurality of second sidewalls cooperatively defining an opening to accommodate the socket body;
a socket plate mounted to the connecting section and,
a load lever assembled to the retaining section to mate with the socket plate; wherein
the frame is stationary during the entire operation of the lever and is vertically engaged with the socket body so as to prevent upward movement of the socket body.

10. The electrical connector assembly as defined in claim 9, wherein the socket body has a longitudinal symmetrical axis, and the protrusions are symmetrically arranged relative to the longitudinal symmetrical axis.

11. The electrical connector assembly as defined in claim 10, wherein the protrusions are located close to the printed circuit board.

12. The electrical connector assembly as defined in claim 10, wherein the protrusions are a plurality of blocks spaced from each other.

13. The electrical connector assembly as defined in claim 10, wherein the protrusions are integral blocks.

14. The electrical connector assembly as defined in claim 13, wherein the protrusions are integrally formed with the first sidewalls.

15. The electrical connector assembly as defined in claim 10, wherein the slots extend across the second sidewalls.

16. The electrical connector assembly as defined in claim 10, wherein the slots do not extend across the second sidewalls.

17. An electrical connector assembly for electrically connecting two electrical interfaces, comprising:
a printed circuit board;
a socket body mounted upon the printed circuit board and comprising a plurality of first sidewalls;
a frame fastened to the printed circuit board and having a plurality of second sidewalls cooperatively defining an opening to compliantly accommodate the socket body;
a socket plate mounted to one end of the socket body; and
a load lever mounted to the other end of the socket body;
wherein the frame is stationary during the entire operation of the lever and catches the socket body so as to prevent the socket body from upward moving away from the printed circuit board.

* * * * *